(12) United States Patent
Yun

(10) Patent No.: US 12,543,324 B2
(45) Date of Patent: Feb. 3, 2026

(54) SEMICONDUCTOR DEVICE AND METHOD FOR FABRICATING THE SAME

(71) Applicant: SK hynix Inc., Icheon-si (KR)

(72) Inventor: Jong Min Yun, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 396 days.

(21) Appl. No.: 18/066,080

(22) Filed: Dec. 14, 2022

(65) Prior Publication Data

US 2023/0380192 A1 Nov. 23, 2023

(30) Foreign Application Priority Data

May 20, 2022 (KR) .......................... 10-2022-0061822

(51) Int. Cl.
*H10B 63/00* (2023.01)
*H10N 70/00* (2023.01)

(52) U.S. Cl.
CPC ........... *H10B 63/80* (2023.02); *H10N 70/021* (2023.02); *H10N 70/063* (2023.02); *H10N 70/068* (2023.02); *H10N 70/8265* (2023.02); *H10N 70/841* (2023.02); *H10N 70/8833* (2023.02)

(58) Field of Classification Search
CPC ... H10N 70/063; H10N 70/826; H10N 70/841
See application file for complete search history.

(56) References Cited

U.S. PATENT DOCUMENTS

| 2013/0087786 A1 | 4/2013 | Kim et al. |
| 2021/0043683 A1 | 2/2021 | Chiang et al. |
| 2023/0380192 A1* | 11/2023 | Yun ...................... H10N 70/068 |

FOREIGN PATENT DOCUMENTS

| KR | 1020140108616 | 9/2014 |
| KR | 20200073716 A | 6/2020 |

OTHER PUBLICATIONS

Ke, Chang, et al., "Thickness-Induced Metal-Insulator Transition in Sb—doped SnO2 Ultrathin Films: The Role of Quantum Confinement," Scientific Reports,5:17424, p. 1-10.
Luo, Qiang, et al., "Thickness-dependent metal-insulator transition in V2O3 ultrathin films," Appl. Phys. Lett. 84, 2337 (2004).
Palina, Natalia, et al., "Investigation of the metal-insulator transition in NdNiO3 films by site-selective X-ray absorption spectroscopy," Nanoscale, 9, 6094-6102, 2017.
Rastogi, Ankur, et al., "Metal-insulator transition in (111) SrRuO3 ultrathin films," APL Mater. 7, 091106 (2019).

(Continued)

*Primary Examiner* — Mark V Prenty
(74) *Attorney, Agent, or Firm* — Perkins Coie LLP

(57) ABSTRACT

An semiconductor device may include a first conductive line; a second conductive line disposed to be spaced apart from the first conductive line; a variable resistance layer disposed between the first conductive line and the second conductive line; and an electrode layer which is disposed at least one of a first location between the first conductive lines and the variable resistance layer, or a second location between the variable resistance layer and the second conductive lines and includes a thickness dependent metal-insulator transition (TDMIT) material that exhibits an electrical resistance depending on a thickness of the TDMIT material.

10 Claims, 17 Drawing Sheets

(56) References Cited

OTHER PUBLICATIONS

Sakai, Enju, et al., Bandwidth-controlled metal-insulator transition in epitaxial PrNiO3 ultrathin films induced by dimensional crossover, Appl. Phys. Lett. 104, 171609 (2014).
Scherwitzl, R., et al., Electric-field tuning of the metal-insulator transition in ultrathin films of LaNiO3, Appl. Phys. Lett. 95, 222114 (2009).
Son, Junwoo, et al., Conductivity enhancement of ultrathin LaNiO3 films in superlattices, Appl. Phys. Lett. 97, 202109 (2010).
Yadav, Ekta, et al., "Influence of Cu doping and thickness on non-Fermi liquid behaviour and metallic conductance in epitaxial PrNiO3 thin films," Applied Physics A (2018) 124:614.
Request for the Submission of an Opinion for KR Appl. No. 10-2022-0061822, mailed on Dec. 18, 2025, 11 pages with English translation.

* cited by examiner

SEMICONDUCTOR DEVICE AND METHOD FOR FABRICATING THE SAME

PRIORITY CLAIM AND CROSS-REFERENCE TO RELATED APPLICATION

This patent document claims the priority and benefits of Korean Patent Application No. 10-2022-0061822 filed on May 20, 2022, which is incorporated herein by reference in its entirety.

TECHNICAL FIELD

This patent document relates to memory circuits or devices and their applications in electronic devices or systems.

BACKGROUND

The recent trend toward miniaturization, low power consumption, high performance, and multi-functionality in the electrical and electronics industry has compelled the semiconductor manufacturers to focus on high-performance, high capacity semiconductor devices. Examples of such high-performance, high capacity semiconductor devices include memory devices that can store data by switching between different resistance states according to an applied voltage or current. The semiconductor devices may include an RRAM (resistive random access memory), a PRAM (phase change random access memory), an FRAM (ferroelectric random access memory), an MRAM (magnetic random access memory), and an electronic fuse (E-fuse).

SUMMARY

The disclosed technology in this patent document includes memory circuits or devices and their applications in semiconductor devices or systems and various implementations of a semiconductor device that can improve the performance of a semiconductor device and reduce manufacturing defects.

In one aspect, a semiconductor device may include: a first conductive line; a second conductive line disposed to be spaced apart from the first conductive line; a variable resistance layer disposed between the first conductive line and the second conductive line; and an electrode layer which is disposed a first location at least one of between the first conductive lines and the variable resistance layer, or a second location between the variable resistance layer and the second conductive lines and includes a thickness dependent metal-insulator transition (TDMIT) material that exhibits an electrical resistance depending on a thickness of the TDMIT material.

In another aspect, a method for fabricating a semiconductor device may include: forming a thickness dependent metal-insulator transition (TDMIT) material layer, the TDMIT material layer having an electrical resistance depending on a thickness of the TDMIT material; forming a variable resistance layer under or above the TDMIT material layer; and performing a patterning process on the TDMIT material layer and the variable resistance layer to form an electrode layer and a variable resistance layer pattern.

DETAILED DESCRIPTION

Hereinafter, various embodiments of the disclosure will be described in detail with reference to the accompanying drawings.

Figure 1A:
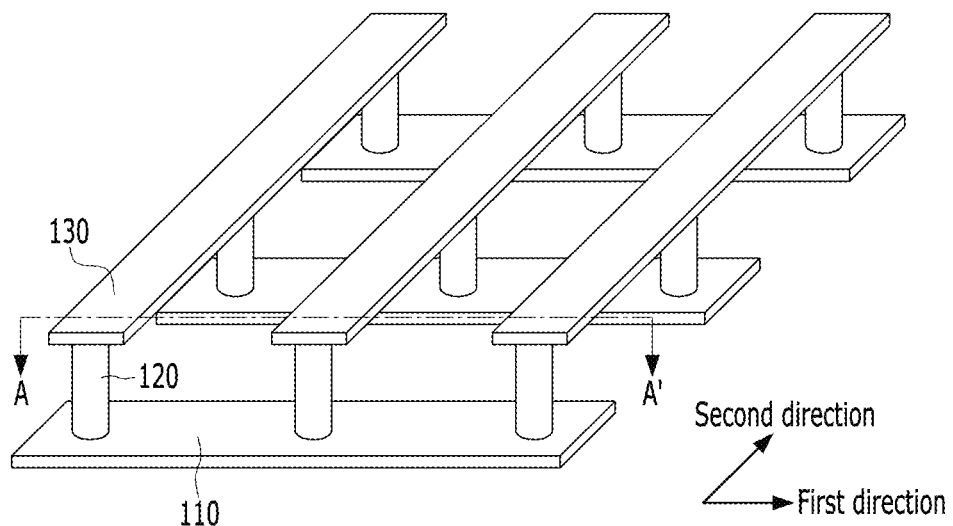
FIGS. 1A and 1B illustrate a semiconductor device based on some implementations of the disclosed technology.
Figure 1B:
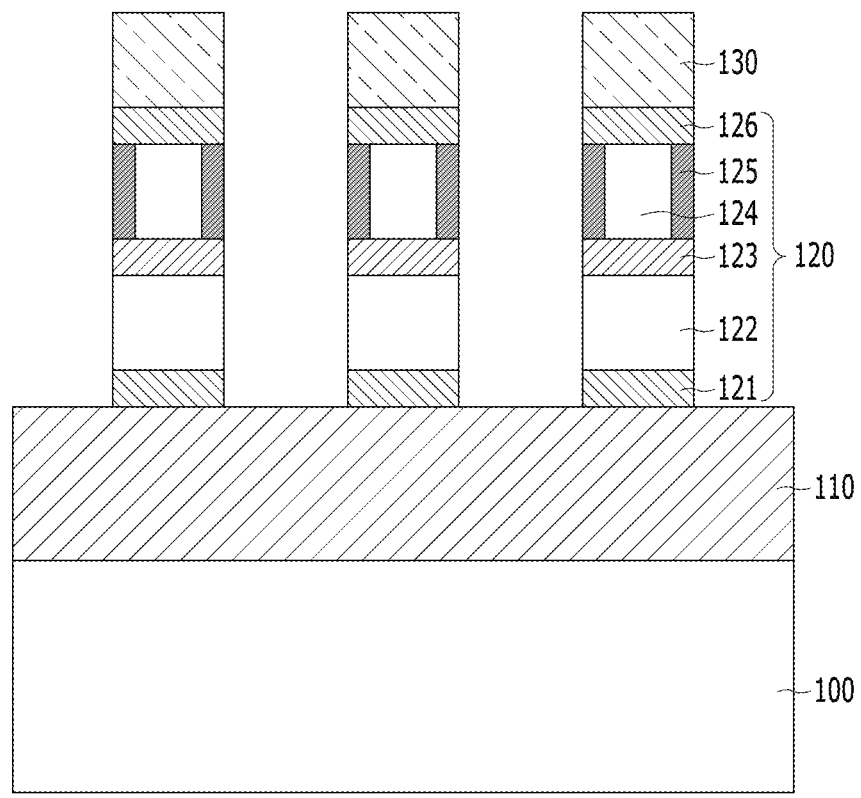

FIGS. 1A and 1B illustrate a semiconductor device based on some implementations of the disclosed technology. FIG. 1A is a perspective view, and FIG. 1B is a cross-sectional view taken along line A-A' of FIG. 1A.

Referring to FIGS. 1A and 1B, the semiconductor device may include a cross-point structure including a substrate 100, first conductive lines 110 formed over the substrate 100 and extending in a first direction, second conductive lines 130 formed over the first conductive lines 110 to be spaced apart from the first conductive lines 110 and extending in a second direction crossing the first direction, and memory cells 120 disposed at intersections of the first conductive lines 110 and the second conductive lines 130 between the first conductive lines and the second conductive lines 130. In this patent document, the conductive lines can indicate conductive structures that electrically connect two or more circuit elements in the semiconductor memory. In some implementations, the conductive lines include word lines that are used control access to memory cells in the memory device and bit lines that are used to read out information stored in the memory cells. In some implementations, the conductive lines include interconnects that carry signals between different circuit elements in the semiconductor memory.

The substrate 100 may include a semiconductor material such as silicon. A required lower structure (not shown) may be formed in the substrate 100. For example, the substrate may include a driving circuit (not shown) electrically connected to the first conductive lines 110 and/or the second conductive lines 130 to control operations of the memory cells 120. In this patent document, the conductive lines can indicate conductive structures that electrically connect two or more circuit elements in the semiconductor device. In some implementations, the conductive lines include word lines that are used control access to memory cells in the memory device and bit lines that are used to read out information stored in the memory cells. In some implementations, the conductive lines include interconnects that carry signals between different circuit elements in the semiconductor device.

The first conductive lines 110 and the second conductive lines 130 may be connected to a lower end and an upper end of the memory cell 120, respectively, and may provide a voltage or a current to the memory cell 120 to drive the memory cell 120. When the first conductive lines 110 functions as a word line, the second conductive lines 130 may function as a bit line. Conversely, when the first conductive lines 110 functions as a bit line, the second conductive lines 130 may function as a word line. The first conductive lines 110 and the second conductive lines 130 may include a single-layer or multilayer structure including one or more of various conductive materials. Examples of the conductive materials may include a metal, a metal nitride, or a conductive carbon material, or a combination thereof, but are not limited thereto. For example, the first conductive lines 110 and the second conductive lines 130 may include tungsten (W), titanium (Ti), tantalum (Ta), platinum (Pt), aluminum (Al), copper (Cu), zinc (Zn), nickel (Ni), cobalt (Co), lead (Pb), tungsten nitride (WN), tungsten silicide (WSi), titanium nitride (TiN), titanium silicon nitride (TiSiN), titanium aluminum nitride (TiAlN), tantalum nitride (TaN), tantalum silicon nitride (TaSiN), tantalum aluminum nitride (TaAlN), carbon (C), silicon carbide (SiC), or silicon carbon nitride (SiCN), or a combination thereof.

The memory cell 120 may be arranged in a matrix having rows and columns along the first direction and the second direction so as to overlap the intersection regions between the first conductive lines 110 and the second conductive lines 130. In an implementation, each of the memory cells 120 may have a size that is substantially equal to or smaller than that of the intersection region between each corresponding pair of the first conductive lines 110 and the second conductive lines 130. In another implementation, each of the memory cells 120 may have a size that is larger than that of the intersection region between each corresponding pair of the first conductive lines 110 and the second conductive lines 130.

Spaces between the first conductive lines 110, the second conductive lines 130 and the memory cell 120 may be filled with a dielectric material.

The memory cell 120 may include a stacked structure including a lower electrode layer 121, a selector layer 122, a middle electrode layer 123, a variable resistance layer 124, a sidewall protection layer 125 and an upper electrode layer 126.

The variable resistance layer 124 may be used to store data by switching between different resistance states according to an applied voltage or current. The variable resistance layer 124 may have a single-layered structure or a multi-layered structure including at least one of materials having a variable resistance characteristic used for an RRAM, a PRAM, an MRAM, an FRAM, and others. For example, the variable resistance layer 124 may include a metal oxide such as a transition metal oxide or a perovskite-based oxide, a phase change material such as a chalcogenide-based material, a ferromagnetic material, a ferroelectric material, or others. However, the implementations are not limited thereto, and the memory cell 120 may include other memory layers capable of storing data in various ways instead of the variable resistance layer 124.

The selector layer 122 may serve to control access to the variable resistance layer 124. In some implementations, the selector layer 122 exhibits different electrically conductive states that are switched by a switching operation by controlling the applied voltage relative to the threshold voltage. The selector layer 122 may include Metal Insulator Transition (MIT) material such as $NbO_2$, $TiO_2$, $VO_2$, $WO_2$, or others, a Mixed Ion-Electron Conducting (MIEC) material such as $ZrO_2(Y_2O_3)$, $Bi_2O_3$—$BaO$, $(La_2O_3)_x(CeO_2)_{1-x}$, or others, an Ovonic Threshold Switching (OTS) material including chalcogenide material such as $Ge_2Sb_2Te_5$, $As_2Te_3$, $As_2$, $As_2Se_3$, or others, or a tunneling insulating material such as silicon oxide, silicon nitride, a metal oxide, or others. A thickness of the tunneling insulating layer is sufficiently small to allow tunneling of electrons through the tunneling insulating layer under a given voltage or a given current. The selector layer 122 may include a single-layer or multilayer structure.

In some implementations, the selector layer 122 may perform a threshold switching operation through a doped region formed in a material layer for the selector layer 122. The selector layer 122 may have a threshold switching characteristic that blocks or substantially limits a current when a magnitude of an applied voltage is less than a predetermined threshold value and allows the current to increase rapidly when the magnitude of the applied voltage is equal to or greater than the predetermined threshold value. This threshold value may be referred to as a threshold voltage, and the selector layer 122 may controlled to be in either a turned-on or "on" state to be electrically conductive or a turned-off or "off" state to be electrically less-conductive than the "on" state or electrically non-conductive depending on whether the applied voltage is above or below the threshold voltage. Thus, a size of the threshold switching operation region may be controlled by a distribution area of the dopants. The dopants may form trap sites for charge carriers in the material layer for the selector layer 122. The trap sites may capture the charge carriers moving in the selector layer 122 based on an external voltage applied to the selector layer 122. The trap sites thereby provide a threshold switching characteristic and are used to perform a threshold switching operation.

In some implementations, the selector layer 122 may include a dielectric material having incorporated dopants. The selector layer 122 may include an oxide with dopants, a nitride with dopants, or an oxynitride with dopants, or a combination thereof such as silicon oxide, titanium oxide, aluminum oxide, tungsten oxide, hafnium oxide, tantalum oxide, niobium oxide, silicon nitride, titanium nitride, aluminum nitride, tungsten nitride, hafnium nitride, tantalum nitride, niobium nitride, silicon oxynitride, titanium oxynitride, aluminum oxynitride, tungsten oxynitride, hafnium oxynitride, tantalum oxynitride, or niobium oxynitride, or a combination thereof. The dopants doped into the selector layer 122 may include an n-type dopant or a p-type dopant and be incorporated for example, by ion implantation process. Examples of the dopants may include one or more of boron (B), nitrogen (N), carbon (C), phosphorous (P), arsenic (As), aluminum (Al), silicon (Si) or germanium (Ge). For example, the selector layer 122 may include As-doped silicon oxide or Ge-doped silicon oxide.

The lower electrode layer 121 may be interposed between the first conductive line and the selector layer 122 and disposed at a lowermost portion of each of the memory cells 120. The lower electrode layer 121 may function as a circuit node that carries a current or applies a voltage between one of the first conductive lines 110 and the remaining portion of each of the memory cells 120. The middle electrode layer 123 may be interposed between the selector layer 122 and the variable resistance layer 124. The middle electrode layer 123 may electrically connect the selector layer 122 and the variable resistance layer 124 to each other while physically isolating or separating the selector layer 122 and the variable resistance layer from each other. The upper electrode layer 126 may be disposed at an uppermost portion of the memory cell 120 and function as a transmission path of electrical signals such as a voltage or a current between a material layer in the memory cell 120 and one of the second conductive lines 130. At least one of the lower electrode layer 121, the middle electrode layer and the upper electrode layer 126 may be omitted.

In the implementations, among the lower electrode layer 121, the middle electrode layer 123 and the upper electrode layer 126, the electrode layer around the variable resistance layer 124 may include a thickness dependent metal-insulator transition (TDMIT) material that exhibits different resistances depending on a thickness. For example, in the implementation shown in FIG. 1B, at least one of the middle electrode layer 123 and the upper electrode layer may include the TDMIT material.

Usually, the electrode adjacent to the variable resistance layer 124, for example, the middle electrode, may have a single-layered structure or a multi-layered structure including various conductive materials such as a metal, a metal nitride, a conductive carbon material, or a combination thereof. For example, the middle electrode may include tungsten (W), titanium (Ti), tantalum (Ta), platinum (Pt), aluminum (Al), copper (Cu), copper (Cu), zinc (Zn), nickel (Ni), cobalt (Co), lead (Pb), tungsten nitride (WN), tungsten silicide (WSi), titanium nitride (TiN), titanium silicon nitride (TiSiN), titanium aluminum nitride (TiAlN), tantalum nitride (TaN), tantalum silicon nitride (TaSiN), tantalum aluminum nitride (TaAlN), carbon (C), silicon carbide (SiC), or silicon carbon nitride (SiCN), or a combination thereof. For example, the middle electrode may include TiN. When the middle electrode is formed by a patterning process, material derived from TiN included in the middle electrode may be redeposited on sidewalls of the variable resistance layer 124 and the redeposited material may cause a shunt fail of the variable resistance layer 124. In order to remove the redeposited material, it is necessary to perform an ion beam etch (IBE) process several times and a sidewall process for protecting the variable resistance layer 124. The multiple IBE processes performed with the sidewall process, however, lower the process efficiency.

In recognition of the problem of lowering process efficiency, in implementations of the disclosed technology, the middle electrode layer 123 and/or the upper electrode layer 126, which is disposed under and above the variable resistance layer 124, may be formed of or include a TDMIT material. In some implementations, when the middle electrode layer 123 and/or the upper electrode layer 126 is patterned, atoms in the TDMIT material is redeposited on the sidewall of the variable resistance layer 124 to form a sidewall protection layer 125.

The middle electrode layer 123 and/or the upper electrode layer 126 may have a thickness that is sufficiently thick to allow the TDMIT material to exhibit electrical conductivity.

The sidewall protection layer 125 may have a thickness that is sufficiently thin to allow the TDMIT material to exhibit an electrically insulating property.

Thicknesses of the middle electrode layer 123 and/or the upper electrode layer 126 may be greater than that of the sidewall protection layer 125.

The TDMIT material refers to a metal insulator transition (MIT) material that exhibits different resistances according to a thickness. For example, the resistance of the TDMIT material may vary nonlinearly depending on the thickness. The MIT material refers to a material of which the electrical resistance rapidly decreases when a transition from a metal to an insulator in the MIT material occurs by being subject to an external stimulation such as a temperature and an electric field applied to the MIT material. When the electrical resistance of the MIT material decreases, the decreased amount may be very large such as about $10^4$ to $10^5$ times of the original electrical resistance. For example, the MIT phenomenon refers to a phenomenon in which an electrically insulating material changes from a first state having an electrically insulating property to a second state having a metallic property and being electrically conductive when a specific temperature or electric field is applied. The TDMIT material refers to a MIT material of which the resistance varies depending on the thickness.

Examples of the TDMIT materials that may be used in certain implementations may include, but are not limited to, at least one of $V_2O_3$, $LaNiO_3$, $SrRuO_3$, $NdNiO_3$, $PrNiO_3$, $SnO_2$:Sb, or a combination thereof. Here, $SnO_2$:Sb represents $SnO_2$ doped with Sb. The resistance of these material may rapidly increase when the thickness is reduced. Thus, if these materials have a thickness less than or equal to a predetermined thickness, they may have an electrically insulating property due to the increased resistance, while if they have a thickness greater than a predetermined thickness, they may have a metallic property and be electrically conductive. The predetermined thickness refers to a thickness at which a transition from a metal to an insulator in the TDMIT materials occurs. For example, the thickness at which a transition from a metal to an insulator in the TDMIT materials occurs is known as follows:

$V_2O_3$: about 5 nm;
$LaNiO_3$: about 10 nm;
$SrRuO_3$: about 2.3-2.7 nm;
$NdNiO_3$: about 3 nm;
$PrNiO_3$: about 12 nm; and
$SnO_2$:Sb: about 3.1 nm.

In the implementations, the middle electrode layer 123 and/or the upper electrode layer 126 may have a thickness that is sufficiently thick to allow the TDMIT material to exhibit electrical conductivity. The thickness of the middle electrode layer 123 and/or the thickness of the upper electrode layer 126 may be selected based on the TDMIT material included the middle electrode layer 123 and/or the upper electrode layer 126. When the middle electrode layer 123 and/or the upper electrode layer 126 is etched away by a patterning process, the TDMIT material may be redeposited on the sidewalls of the variable resistance layer 124. The patterning process of the middle electrode layer 123 and/or the upper electrode layer 126 may be usually performed by an IBE process. During the IBE process, the TDMIT material may be redeposited on the sidewalls of the variable resistance layer 124 and the redeposited TDMIT material may have a thin thickness. The redeposited TDMIT material form a sidewall protection layer. Since the sidewall protection layer 125 may have a small thickness, the TDMIT material included in the sidewall protection layer 125 can exhibit an electrically insulating property. According to the implementations, the electrode around the variable resistance layer 124 can exhibit conductivity and the sidewall protection layer 125 formed on the sidewalls of the resistance layer 124 can exhibit an electrically insulating property. A shunt fail due to a bypass current can be prevented or reduced by the sidewall protection layer 125. It is also possible to significantly reduce or omit the IBE process for removing the redeposited material and the sidewall process for protecting the variable resistance layer 124, which have been usually performed in the conventional process as described above, which improves the process efficiency and easiness of the process. Moreover, the sidewall protection layer 125 can be formed by using the redeposition that inevitably occurs during patterning of the middle electrode layer 123 and/or upper electrode layer 126 without requiring a separate process for forming the sidewall protection layer 125. Therefore, the implementation can improve the process efficiency by using the redeposition which occurs during the patterning of the middle electrode layer 123 and/or upper electrode layer 126 to form a sidewall protection layer 125.

The lower electrode layer 121 which is not contact with the variable resistance layer 124, and the middle electrode layer 123 or the upper electrode layer 126 which does not include the TDMIT material may have a single-layer or multilayer structure including various conductive materials such as a metal, a metal nitride, a conductive carbon material, or a combination thereof. For example, the lower electrode layer 121 may include tungsten (W), titanium (Ti), tantalum (Ta), platinum (Pt), aluminum (Al), copper (Cu), zinc (Zn), nickel (Ni), cobalt (Co), lead (Pb), tungsten nitride (WN), tungsten silicide (WSi), titanium nitride (TiN), titanium silicon nitride (TiSiN), titanium aluminum nitride (TiAlN), tantalum nitride (TaN), tantalum silicon nitride (TaSiN), tantalum aluminum nitride (TaAlN), carbon (C), silicon carbide (SiC), or silicon carbon nitride (SiCN), or a combination thereof.

In some implementations, each of the memory cells 120 includes the lower electrode layer 121, the selector layer 122, the middle electrode layer 123, the variable resistance layer 124, the sidewall protection layer 125 and the upper electrode layer 126. The structures of the memory cells 120 may be varied without being limited to one as shown in FIGS. 1A and 1B as long as the memory cells 120 have data storage properties. In some implementations, at least one of the lower electrode layer 121, the middle electrode layer 123 and the upper electrode layer 126 may be omitted. For example, when the lower electrode layer 121 is omitted, the first conductive lines 110 may perform the function of the lower electrode layer 121. When the upper electrode layer 126 is omitted, the second conductive lines 130 may perform the function of the upper electrode layer 126. In some implementations, the relative position of the variable resistance layer 124 and the selector layer 122 may be reversed. In some implementations, in addition to the layers 121 to 126 shown in FIG. 1B, the memory cells 120 may further include one or more layers (not shown) for enhancing characteristics of the memory cells 120 or improving fabricating processes.

In some implementations, neighboring memory cells of the plurality of memory cells may be spaced apart from each other at a predetermined interval, and trenches may be present between the plurality of memory cells 120. A trench between neighboring memory cells 120 may have a height to width ratio (i.e., an aspect ratio) in a various range which includes from 1:1 to 40:1, from 10:1 to 40:1, from 10:1 to 20:1, from 5:1 to 10:1, from 10:1 to 15:1, from 1:1 to 25:1, from 1:1 to 30:1, from 1:1 to 35:1, or from 1:1 to 45:1.

In some implementations, the trench may have sidewalls that are substantially perpendicular to an upper surface of the substrate 100. In some implementations, neighboring trenches may be spaced apart from each other by an equal or similar distance.

In some implementations, the semiconductor device may include further layers in addition to the first conductive lines 110, the memory cell 120 and the second conductive lines 130.

Although one cross-point structure has been described, two or more cross-point structures may be stacked in a vertical direction perpendicular to a top surface of the substrate 100.

A method for fabricating a semiconductor device will be explained with reference to FIGS. 2A to 2D. The detailed descriptions similar to those described in the implementation of FIGS. 1A and 1B will be omitted.

FIGS. 2A to 2D are cross-sectional views illustrating an example method for fabricating a semiconductor device based on some implementations of the disclosed technology.

Figure 2A:
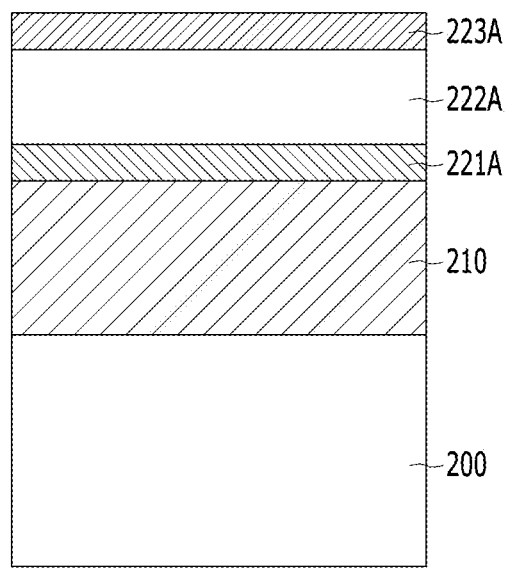
FIGS. 2A to 2D are cross-sectional views illustrating an example method for fabricating a semiconductor device based on some implementations of the disclosed technology.

Referring to FIG. 2A, first conductive lines 210 may be formed over a substrate 200 in which a predetermined structure is formed. The first conductive lines 210 may be formed by forming a conductive layer for the first conductive lines 210 and etching the conductive layer using a mask pattern in a line shape extending in a first direction. The first conductive lines 210 may have a single-layered structure or a multi-layered structure including a conductive material.

Then, a material layer 221A for forming a lower electrode layer, a material layer 222A for forming a selector layer and a material layer 223A for forming a middle electrode layer may be sequentially formed over the first conductive lines 210.

The material layer 221A may have a single-layer or multilayer structure including various conductive materials such as a metal, a metal nitride, a conductive carbon material, or a combination thereof.

The material layer 222A may include an MIT material, and MIEC material, an OTS material including a chalcogenide-based material, a tunneling insulating material, a doped insulating material, or others.

The material layer 223A may include a TDMIT material. In some implementations, the material layer 223A may include $V_2O_3$, $LaNiO_3$, $SrRuO_3$, $NdNiO_3$, $PrNiO_3$, or $SnO_2$:Sb, or a combination thereof.

The material layer 223A may have a thickness that is sufficiently thick to allow the TDMIT material to exhibit conductivity. The thickness of the material layer 223A may be determined depending on the TDMIT material included in the material layer 223A.

Figure 2B:
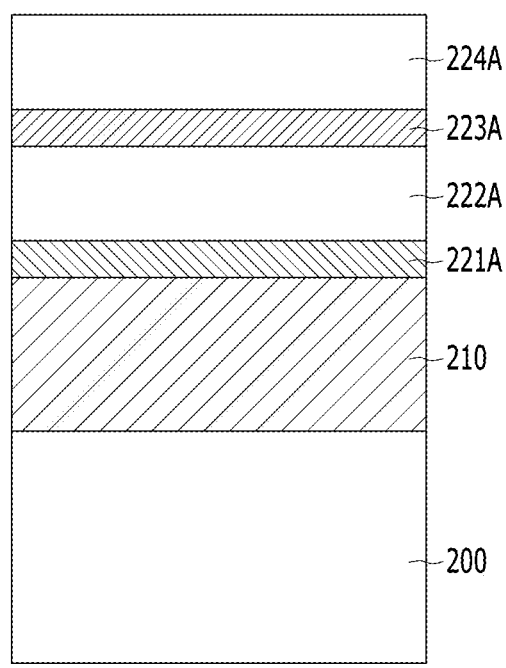

Referring to FIG. 2B, a material layer 224A for forming a variable resistance layer may be formed on the structure of FIG. 2A.

The material layer 224A may include an MTJ structure.

Figure 2C:
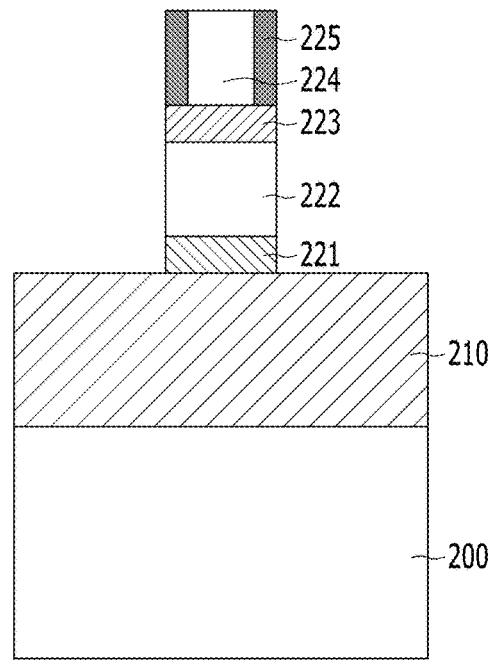

Referring to FIG. 2C, a lower electrode layer 221, a selector layer 222, a middle electrode layer 223, a variable resistance layer 224 and a sidewall protection layer 225 may be formed by sequentially etching the material layer 224A, the material layer 223A, the material layer 222A and the material layer 221A through a patterning process using a mask pattern (not shown).

Here, the patterning process may be performed, for example, by an IBE process.

During the patterning process, atoms included in the TDMIT material may be redeposited on sidewall of the variable resistance layer 224 by etching the material layer 223A to form the sidewall protection layer 225.

The sidewall protection layer 225 may have a thickness that is sufficiently thin to allow the TDMIT material to exhibit an electrically insulating property. The thickness of the sidewall protection layer 225 may be determined depending on the TDMIT material included in the sidewall protection layer 225. Since the material layer redeposited by the IBE process has a thin thickness, the sidewall protection layer 225 may have a thickness such that the TDMIT material can exhibit an insulating property.

The sidewall protection layer 225 can allow for significantly reducing a shunt fail rate (SFR) and a turnaround time (TAT) of the process. Further, it is possible to omit a separate process for removing the redeposited material.

Figure 2D:
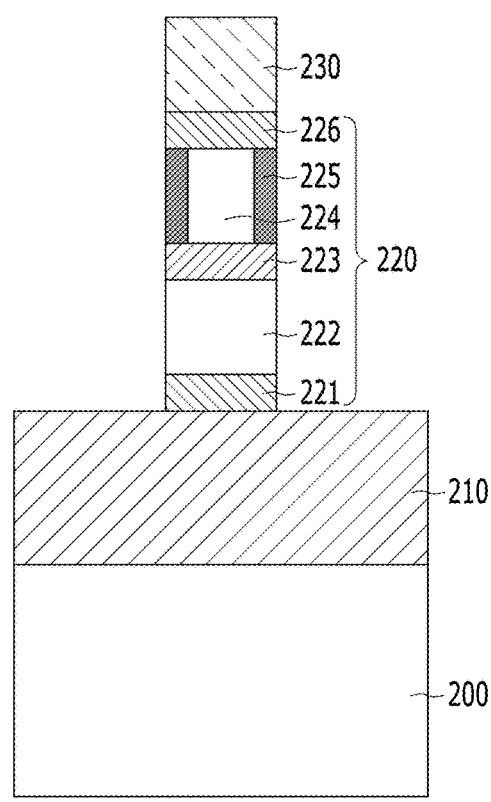

Referring to FIG. 2D, an upper electrode layer 226 and second conductive lines 230 may be formed on the structure of FIG. 2C.

The upper electrode layer 226 may have a single-layer or multilayer structure including various conductive materials such as a metal, a metal nitride, a conductive carbon material, or a combination thereof. The upper electrode layer 226 may be formed by forming a material layer for forming the upper electrode layer 226 and etching the material layer using a mask pattern.

In the implementation, the upper electrode layer 226 may be etched by a separate patterning process from a patterning process for the variable resistance layer 224. In another implementation, the upper electrode layer 226 may be simultaneously etched in the pattering process for etching the variable resistance layer 224. For example, the lower electrode layer 221, the selector layer 222, the middle electrode layer 223, the variable resistance layer 224, the sidewall protection layer 225 and the upper electrode layer 226 may be formed by forming a material layer for forming the upper electrode layer 226 on the material layer 224A after the step of FIG. 2B, and sequentially etching the material layer for the upper electrode layer 226, the material layer for the variable resistance layer 224, the material layer 223A, the material layer 222A and the material layer 221A using a mask pattern (not shown).

The second conductive lines 230 may be formed by forming a conductive layer for forming the second conductive lines 230 and etching the conductive layer using a mask pattern in a line shape extending in a second direction. The second conductive lines 230 may include a single-layer or multilayer structure including one or more of various conductive materials.

The semiconductor device formed by the method described in FIGS. 2A to 2D may include the substrate 200, the first conductive lines 210, a memory cell 220 and the second conductive lines 230. The memory cell 220 may include the lower electrode layer 221, the selector layer 222, the middle electrode layer 223, the variable resistance layer 224, the sidewall protection layer 225, and the upper electrode layer 226. The middle electrode layer 223 may include the TDMIT material. The middle electrode layer 223 may have a thickness that is sufficiently thick to allow the TDMIT material to be electrically conductive. The sidewall protection layer 225 may include the redeposited TDMIT material derived from the middle electrode layer 223. The sidewall protection layer 225 may have a thickness that is sufficiently thin to allow the TDMIT material to exhibit an insulating property.

According to the implementations, since the sidewall protection layer 225 exhibiting an insulating property is formed on the sidewalls of the variable resistance layer 224, a shunt fail and a process TAT can be reduced. Further, several IBE processes for removing the redeposited material and a sidewall process for protecting the variable resistance layer 224 can be significantly reduced or omitted.

In the implementation, the middle electrode layer 223 is formed of or includes the TDMIT material. In another implementation, the upper electrode layer 226 may be formed of or include the TDMIT material. In another implementation, both the middle electrode layer and the upper electrode layer 226 may be formed of or include the TDMIT material.

In some implementations, the semiconductor device in accordance with the implementation includes the lower electrode layer 221, the middle electrode layer 223 and the upper electrode layer 226. In another implementation, at least one of the upper electrode layer or the lower electrode layer 221 may be omitted.

In some implementations, the variable resistance layer 224 is disposed on the selector layer 222. In another implementation, the variable resistance layer 224 may be disposed below the selector layer 222.

The substrate 200, the first conductive lines 210, the memory cell 220, the lower electrode layer 221, the selector layer 222, the middle electrode layer 223, the variable resistance layer 224, the sidewall protection layer 225, the upper electrode layer 226 and the second conductive lines 230 shown in FIG. 2D may correspond to the substrate 100, the first conductive lines 110, the memory cell 120, the lower electrode layer 121, the selector layer 122, the middle electrode layer 123, the variable resistance layer 124, the sidewall protection layer 125, the upper electrode layer 126 and the second conductive lines 130 shown in FIG. 1B, respectively.

FIGS. 3A to 3E are cross-sectional views illustrating another example method for fabricating a semiconductor device based on some implementations of the disclosed technology.

The implementation shown in FIGS. 3A to 3E may be similar to the implementation shown in FIGS. 2A to 2D except that a lower electrode contact 340 and an upper electrode contact 350 are formed. The detailed descriptions similar to those described in the implementation of FIGS. 2A to 2D will be omitted.

Figure 3A:
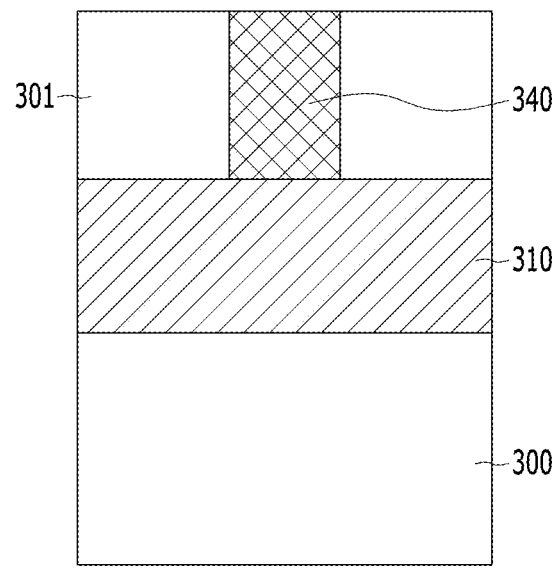
FIGS. 3A to 3E are cross-sectional views illustrating another example method for fabricating a semiconductor device based on some implementations of the disclosed technology.

Referring to FIG. 3A, a first conductive line 310 may be formed over a substrate 300 in which a predetermined structure is formed. The first conductive line 310 may be formed by forming a conductive layer for the first conductive line 310 and etching the conductive layer using a mask pattern in a line shape extending in a first direction.

Then, an interlayer dielectric layer 301 having a hole may be formed over the first conductive line 310. A lower electrode contact 340 may be formed by forming the lower electrode contact 340 in the hole and performing a planarization process.

The lower electrode contact 340 may have a single-layer or multilayer structure including various conductive materials such as a metal, a metal nitride, a conductive carbon material, or a combination thereof.

Figure 3B:
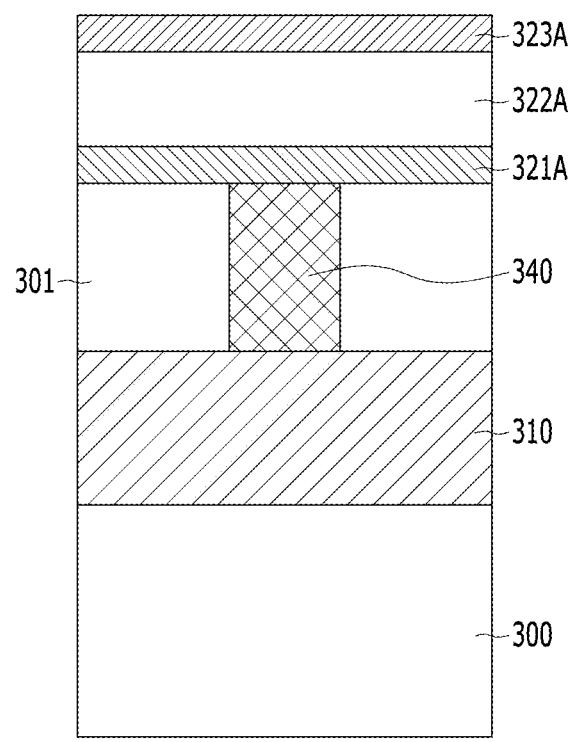

Referring to FIG. 3B, a material layer 321A forming a lower electrode layer, a material layer 322A for forming a selector layer and a material layer 323A for forming a middle electrode layer may be sequentially formed over the interlayer dielectric layer 301 and the lower electrode contact 340.

The material layer 323A may include a TDMIT material. In some implementations, the material layer 323A may include $V_2O_3$, $LaNiO_3$, $SrRuO_3$, $NdNiO_3$, $PrNiO_3$, $SnO_2$:Sb, or a combination thereof.

The material layer 323A may have a thickness that is sufficiently thick to allow the TDMIT material to exhibit conductivity. The thickness of the material layer 323A may be determined depending on the TDMIT material included in the material layer 323A.

Figure 3C:
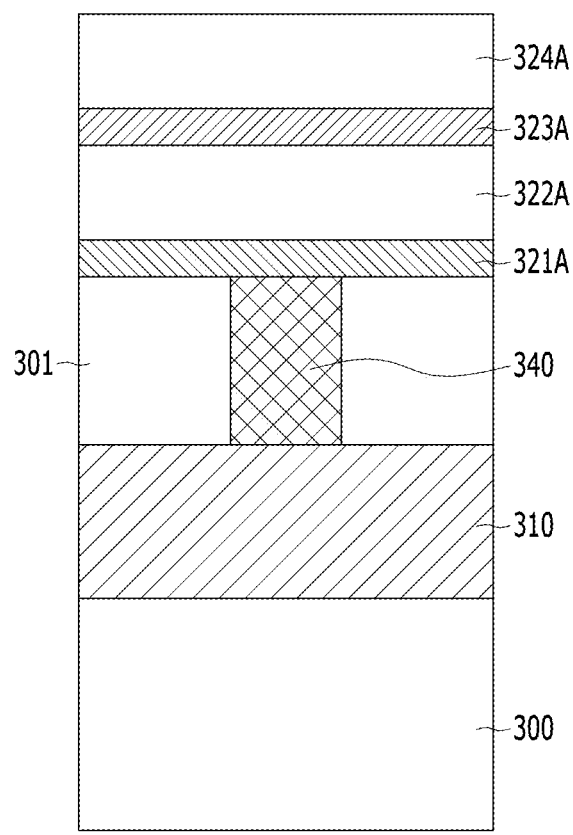

Referring to FIG. 3C, a material layer 324A for forming a variable resistance layer may be formed over the structure of FIG. 3B.

Figure 3D:
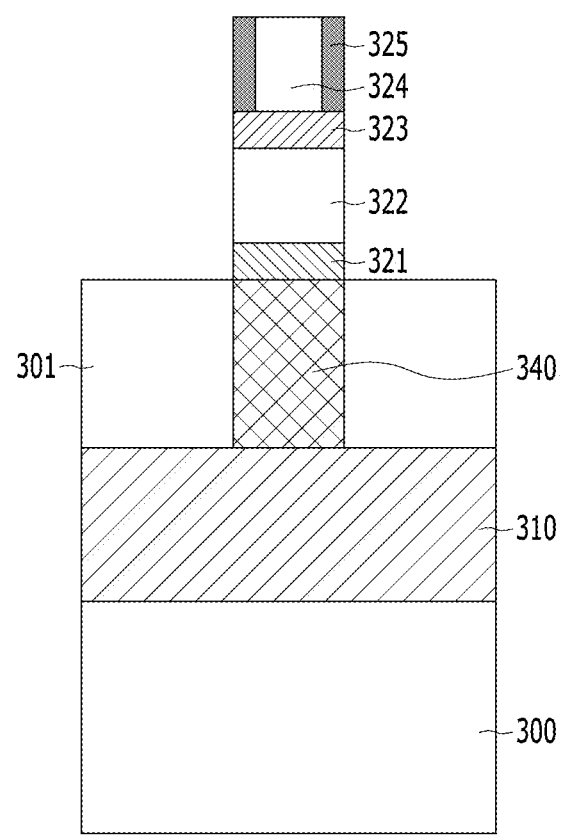

Referring to FIG. 3D, a lower electrode layer 321, a selector layer 322, a middle electrode layer 323, a variable resistance layer 324 and a sidewall protection layer 325 may be formed by sequentially etching the material layer 324A, the material layer 323A, selector layer and the material layer 321A.

Here, the patterning process may be performed, for example, by an IBE process.

During the patterning process, the TDMIT material may be redeposited on sidewalls of the variable resistance layer 324 by etching the material layer 323A to form the sidewall protection layer 325.

The sidewall protection layer 325 may have a thickness that is sufficiently thin to allow the TDMIT material to exhibit an insulating property. Accordingly, the thickness of the sidewall protection layer 325 may be determined depending on the TDMIT material included in the sidewall protection layer 325. Since the material layer redeposited by the IBE process has a thin thickness, the sidewall protection layer 325 may have a thickness that is sufficiently thin to allow the TDMIT material to exhibit an insulating property.

Figure 3E:
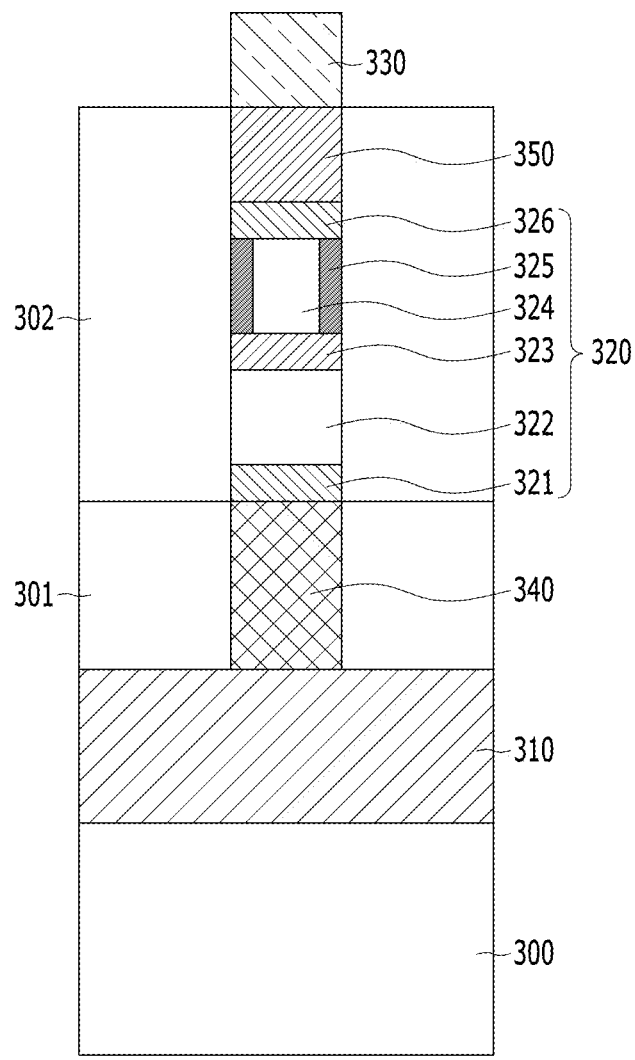

Referring to FIG. 3E, an upper electrode layer 326, an upper electrode contact 350 and a second conductive line 330 may be formed over the structure of FIG. 3D.

The upper electrode contact 350 may be formed by forming an interlayer dielectric layer 302 having a hole, forming a material layer for forming the upper electrode contact 350, and performing a planarization process.

Alternatively, in another implementation, the upper electrode layer 326 and the upper electrode contact 350 may be formed by forming the interlayer dielectric layer 302 having a hole, forming a material layer for forming the upper electrode layer 326 and a material layer for the upper electrode contact 350, and performing a planarization process.

The material layer for the lower electrode contact 340 may have a single-layer or multilayer structure including various conductive materials such as a metal, a metal nitride, a conductive carbon material, or a combination thereof.

The second conductive line 330 may be formed by forming a conductive layer for forming the second conductive line 330 and etching the conductive layer using a mask pattern in a line shape extending in a second direction. The second conductive line 330 may include a single-layer or multilayer structure including one or more of various conductive materials.

The semiconductor device formed by the method described in FIGS. 3A to 3E may include the substrate 300, the first conductive line 310, the lower electrode contact 340, a memory cell 320, the upper electrode contact 350 and the second conductive line 330. The memory cell 320 may include the lower electrode layer 321, the selector layer 322, the middle electrode layer 333, the variable resistance layer 324, the sidewall protection layer 325, and the upper electrode layer 326. The middle electrode layer 323 may include the TDMIT material. The middle electrode layer 323 may have a thickness that is sufficiently thick to allow the TDMIT material to be electrically conductive. The sidewall protection layer 325 may include the redeposited TDMIT material derived from the middle electrode layer 323. The sidewall protection layer 325 may have a thickness that is sufficiently thin to allow the TDMIT material to exhibit an insulating property.

According to the implementations, since the sidewall protection layer 325 exhibiting an insulating property is formed on the sidewalls of the variable resistance layer 324, a shunt fail and a process TAT can be reduced. Further, several segmented IBE processes for removing the redeposited material and a sidewall process for protecting the variable resistance layer 324 can be significantly omitted.

In the implementation, the middle electrode layer 323 is formed of or includes the TDMIT material. In another implementation, the upper electrode layer 326 may be formed of or include the TDMIT material. In another implementation, both the middle electrode layer and the upper electrode layer 226 may be formed of or include the TDMIT material.

Moreover, in the implementation, the semiconductor device has the lower electrode contact 340 and the upper electrode contact 350. In another implementation, at least one of the lower electrode contact 340 or the upper electrode contact 350 may be omitted.

Further, the semiconductor device in accordance with the implementation includes the lower electrode layer 321, the middle electrode layer 323 and the upper electrode layer 326. In another implementation, at least one of the upper electrode layer 326 or the lower electrode layer 321 may be omitted.

Further, in the implementation, the variable resistance layer 324 is disposed on the selector layer 322. In another implementation, the variable resistance layer 324 may be disposed below the selector layer 322.

The substrate 300, the first conductive line 310, the memory cell 320, the lower electrode layer 321, the selector layer 322, the middle electrode layer 323, the variable resistance layer 324, the sidewall protection layer 325, the upper electrode layer 326 and the second conductive line 330 shown in FIG. 3E may correspond to the substrate 200, the first conductive line 210, the memory cell 220, the lower electrode layer 221, the selector layer 222, the middle electrode layer 223, the variable resistance layer 224, the sidewall protection layer 225, the upper electrode layer 226 and the second conductive line 230 shown in FIG. 2D, respectively, and the substrate 100, the first conductive line 110, the memory cell 120, the lower electrode layer 121, the selector layer 122, the middle electrode layer 123, the variable resistance layer 124, the sidewall protection layer 125, the upper electrode layer 126 and the second conductive line 130 shown in FIG. 1B, respectively.

Figure 4A:
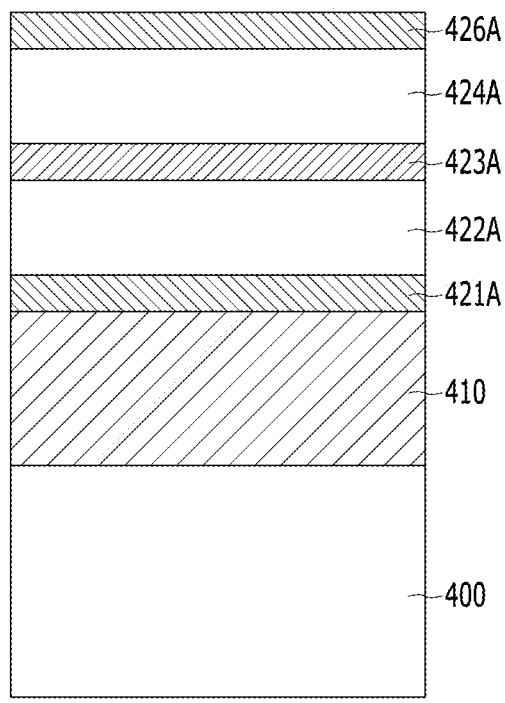
FIGS. 4A to 4C are cross-sectional views illustrating another example method for fabricating a semiconductor device based on some implementations of the disclosed technology.
Figure 4B:
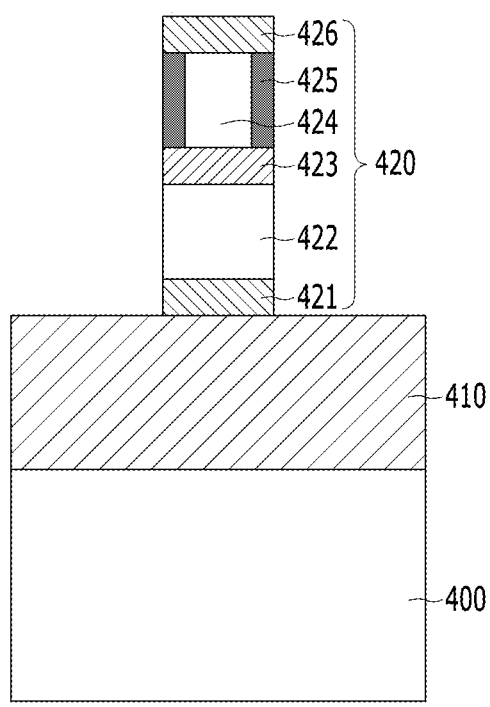
Figure 4C:
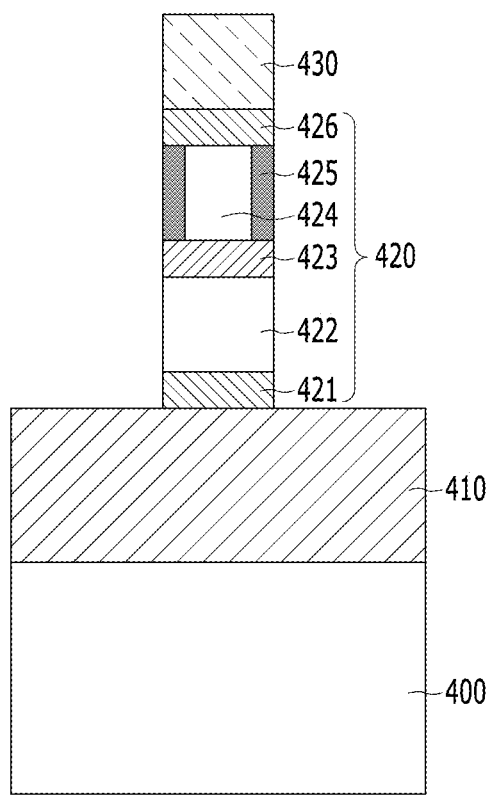

FIGS. 4A to 4C are cross-sectional views illustrating another example method for fabricating a semiconductor device based on some implementations of the disclosed technology.

The detailed descriptions similar to those described in the implementation of FIGS. 2A to 2D will be omitted.

Referring to FIG. 4A, a first conductive line 410 may be formed over a substrate 400 in which a predetermined structure is formed.

Then, a material layer 421A for forming a lower electrode layer, a material layer 422A forming a selector layer, a material layer 423A forming a middle electrode layer, a material layer 424A for forming a variable resistance layer and a material layer 426A for forming an upper electrode layer.

The material layer 421A and the material layer 423A may have a single-layer or multilayer structure including various conductive materials such as a metal, a metal nitride, a conductive carbon material, or a combination thereof.

The material layer 426A may include a TDMIT material. In some implementations, the material layer 426A may include $V_2O_3$, $LaNiO_3$, $SrRuO_3$, $NdNiO_3$, $PrNiO_3$, $SnO_2$:Sb, or a combination thereof.

The material layer 426A may have a thickness that is sufficiently thick to allow the TDMIT material to exhibit conductivity. The thickness of the material layer 426A may be determined depending on the TDMIT material included in the material layer 426A.

Referring to FIG. 4B, a lower electrode layer 421, a selector layer 422, a middle electrode layer 423, a variable resistance layer 424, a sidewall protection layer 425 and an upper electrode layer 426 may be formed by sequentially etching the material layer 426A, the material layer 424A, the material layer 423A, the material layer 422A and the material layer 421A through a patterning process using a mask pattern (not shown).

Here, the patterning process may be performed, for example, by an IBE process.

During the patterning process, the TDMIT material may be redeposited on sidewalls of the variable resistance layer 424 by etching the material layer 426A to form the sidewall protection layer 425.

The sidewall protection layer 425 may have a thickness that is sufficiently thick to allow the TDMIT material to exhibit an insulating property. The thickness of the sidewall protection layer 425 may be determined depending on the TDMIT material included in the sidewall protection layer 425. Since the material layer redeposited by the IBE process has a thin thickness, the sidewall protection layer 425 may have a thickness that is sufficiently thin to allow the TDMIT material to exhibit an insulating property.

The sidewall protection layer 425 can allow for significantly reducing a shunt fail rate (SFR) and a turnaround time (TAT) of the process. Further, it is possible to omit a separate process for removing the redeposited material.

Referring to FIG. 4C, a second conductive line 430 may be formed over the upper electrode layer 426.

The semiconductor device formed by the method described in FIGS. 4A to 4C may include the substrate 400, the first conductive line 410, a memory cell 420 and the second conductive line 430. The memory cell 420 may include the lower electrode layer 421, the selector layer 422, the middle electrode layer 423, the variable resistance layer 424, the sidewall protection layer 425, and the upper electrode layer 426. The upper electrode layer 426 may include the TDMIT material. The upper electrode layer 426 may have a thickness that is sufficiently thick to allow the TDMIT material to be conductive. The sidewall protection layer may include the redeposited TDMIT material derived from the upper electrode layer 426. The sidewall protection layer 425 may have a thickness that is sufficiently thin to allow the TDMIT material to exhibit an insulating property.

In the implementation, the upper electrode layer 426 is formed of or includes the TDMIT material. In another implementation, the middle electrode layer 423 may be formed of or include the TDMIT material. In another implementation, both the middle electrode layer and the upper electrode layer 426 may be formed of or include the TDMIT material.

Moreover, the semiconductor device in accordance with the implementation includes the lower electrode layer 421, the middle electrode layer 423 and the upper electrode layer 426. In another implementation, at least one of the middle electrode layer 423 or the lower electrode layer 421 may be omitted.

Further, in the implementation, the variable resistance layer 424 is disposed on the selector layer 422. In another implementation, the variable resistance layer 424 may be disposed below the selector layer 422.

In the implementations described above, each of the semiconductor devices include the selector layer 122, 222, 322 or 422 and the variable resistance layer 124, 224, 324 or 424 are formed on an upper portion and a lower portion of the same element in order to form a high-density cross-point array. However, in another implementation, a semiconductor device may include only the variable resistance layer such as a magnetic tunnel junction (MTJ) in the element. This will be described with reference to FIGS. 5A to 5D and FIGS. 6A to 6C.

FIGS. 5A to 5D are cross-sectional views illustrating another example method for fabricating a semiconductor device based on some implementations of the disclosed technology. The detailed descriptions similar to those described in the implementations of FIGS. 1A and 1B, FIGS. 2A to 2D, FIGS. 3A to 3E and FIGS. 4A to 4C will be omitted.

Figure 5A:
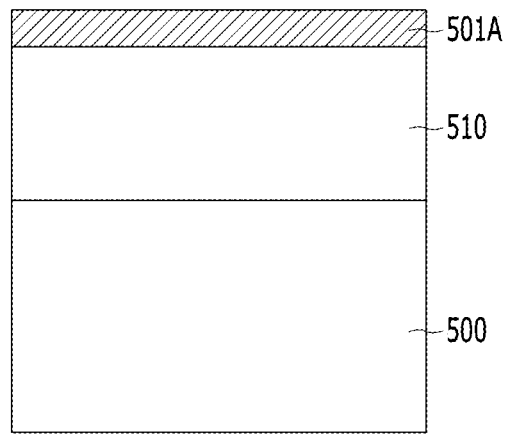
FIGS. 5A to 5D are cross-sectional views illustrating another example method for fabricating a semiconductor device based on some implementations of the disclosed technology.
Figure 5B:
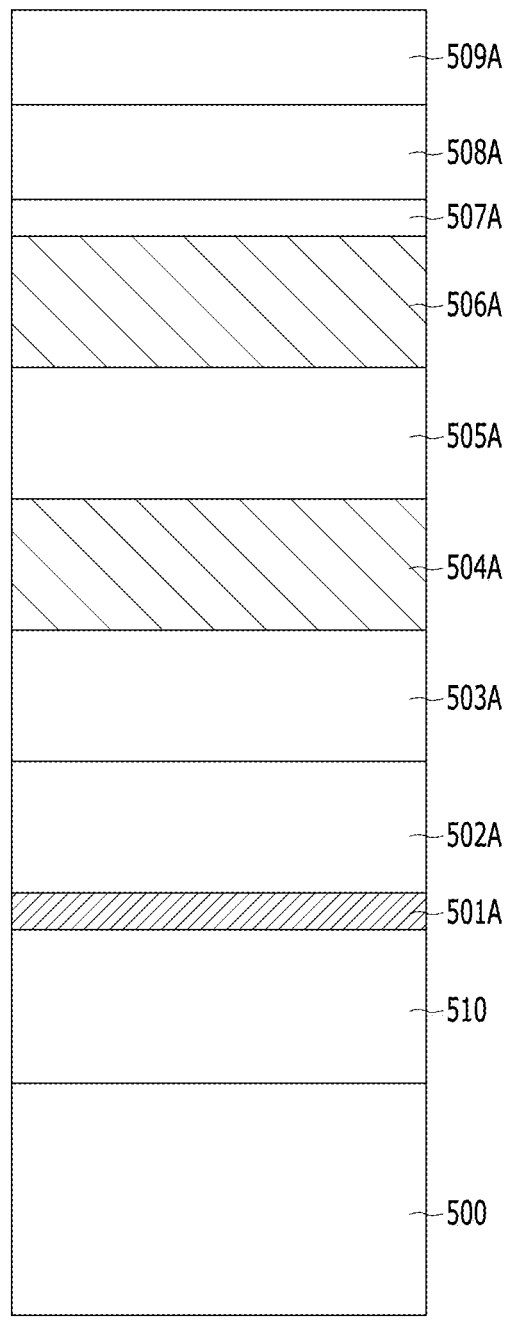
Figure 5C:
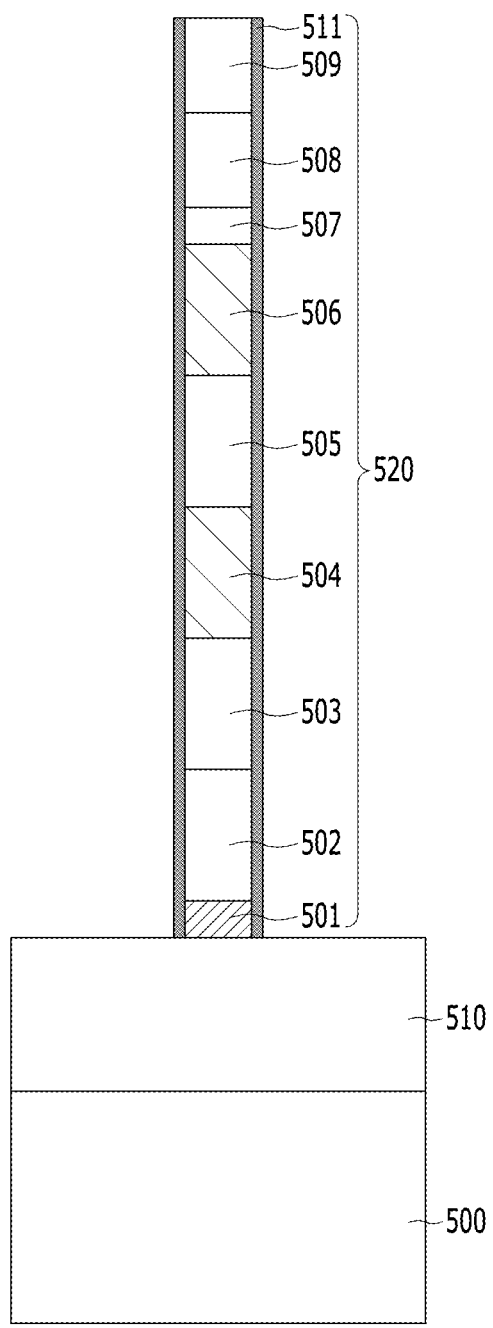
Figure 5D:
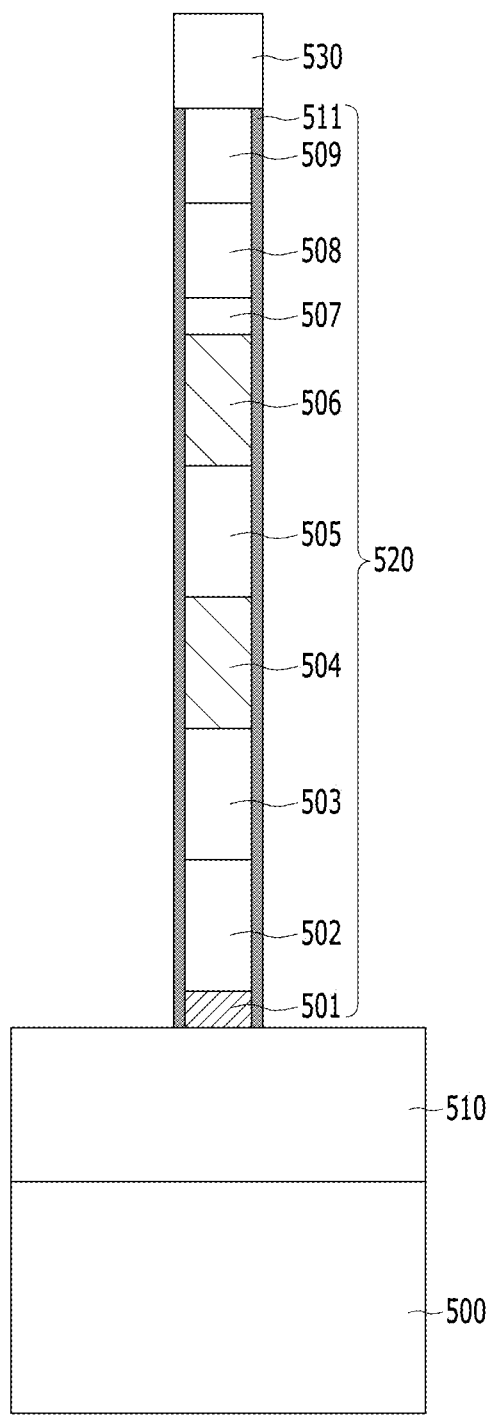

First, referring to FIG. 5D, the semiconductor device in accordance with an implementation may include first conductive line 510 disposed over a substrate 500 and extending in a first direction, second conductive line 530 disposed over the first conductive line 510 and extending in a second direction crossing the first direction, and a variable resistance element 520 disposed at intersections of the first conductive line 510 and the second conductive line 530 between the first conductive line 510 and the second conductive line 530. The variable resistance element 520 may include a magnetic tunnel junction (MTJ) structure including a free layer 504 having a variable magnetization direction, a pinned layer 506 having a pinned magnetization direction and a tunnel barrier layer 505 interposed between the free layer 504 and the pinned layer 506.

The free layer 504 may have one of different magnetization directions or one of different spin directions of electrons to switch the polarity of the free layer 504 in the MTJ structure, resulting in changes in resistance value. In some implementations, the polarity of the free layer 504 is changed or flipped upon application of a voltage or current signal (e.g., a driving current above a certain threshold) to the MTJ structure. With the polarity changes of the free layer 504, the free layer 504 and the pinned layer 506 have different magnetization directions or different spin directions of electron, which allows the variable resistance element to store different data or represent different data bits. The free layer 504 may also be referred to as a storage layer. The magnetization direction of the free layer 504 may be substantially perpendicular to a surface of the free layer 504, the tunnel barrier layer 505 and the pinned layer 506. In other words, the magnetization direction of the free layer 504 may be substantially parallel to stacking directions of the free layer 504, the tunnel barrier layer 505 and the pinned layer 506. Therefore, the magnetization direction of the free layer 504 may be changed between a downward direction and an upward direction. The change in the magnetization direction of the free layer 504 may be induced by a spin transfer torque generated by an applied current or voltage.

The free layer 504 may have a single-layer or multilayer structure including a ferromagnetic material. For example, the free layer 504 may include an alloy based on Fe, Ni or Co, for example, an Fe—Pt alloy, an Fe—Pd alloy, a Co—Pd alloy, a Co—Pt alloy, a Co—Fe alloy, an Fe—Ni—Pt alloy, a Co—Fe—Pt alloy, a Co—Ni—Pt alloy, or a Co—Fe—B alloy, or others, or may include a stack of metals, such as Co/Pt, or Co/Pd, or others.

The tunnel barrier layer 505 may allow the tunneling of electrons in both data reading and data writing operations. In a write operation for storing new data, a high write current may be directed through the tunnel barrier layer 505 to change the magnetization direction of the free layer 504 and thus to change the resistance state of the MTJ for writing a new data bit. In a reading operation, a low reading current may be directed through the tunnel barrier layer 505 without changing the magnetization direction of the free layer 504 to measure the existing resistance state of the MTJ under the existing magnetization direction of the free layer 504 to read the stored data bit in the MTJ. The tunnel barrier layer 505 may include a dielectric oxide such as MgO, CaO, SrO, TiO, VO, or NbO or others.

The pinned layer 506 may have a pinned magnetization direction, which remains unchanged while the magnetization direction of the free layer 504 changes. The pinned layer may be referred to as a reference layer. In some implementations, the magnetization direction of the pinned layer 506 may be pinned in a downward direction. In some implementations, the magnetization direction of the pinned layer 506 may be pinned in an upward direction.

The pinned layer 506 may have a single-layer or multilayer structure including a ferromagnetic material. For example, the pinned layer 506 may include an alloy based on Fe, Ni or Co, for example, an Fe—Pt alloy, an Fe—Pd alloy, a Co—Pd alloy, a Co—Pt alloy, a Co—Fe alloy, an Fe—Ni—Pt alloy, a Co—Fe—Pt alloy, a Co—Ni—Pt alloy, or a Co—Fe—B alloy, or may include a stack of metals, such as Co/Pt, or Co/Pd or others.

If a voltage or current is applied to the variable resistance element 520, the magnetization direction of the free layer 504 may be changed by spin torque transfer. In some implementations, when the magnetization directions of the free layer 504 and the pinned layer are parallel to each other, the variable resistance element 520 may be in a low resistance state, and this may indicate digital data bit "0." Conversely, when the magnetization directions of the free layer 504 and the pinned layer 506 are anti-parallel to each other, the variable resistance element 520 may be in a high resistance state, and this may indicate a digital data bit "1." In some implementations, the variable resistance element 520 can be configured to store data bit 1' when the magnetization directions of the free layer 504 and the pinned layer 506 are parallel to each other and to store data bit '0' when the magnetization directions of the free layer 504 and the pinned layer 506 are anti-parallel to each other.

In some implementations, the variable resistance element 520 may further include one or more layers performing various functions to improve a characteristic of the MTJ structure. For example, the variable resistance element 520 may further include a lower electrode layer 501, a buffer layer 502, an under layer 503, a spacer layer 507, a magnetic correction layer 508, a capping layer 509 and a sidewall protection layer 511.

The lower electrode layer 501 may include a TDMIT material. In some implementations, the lower electrode layer 501 may include $V_2O_3$, $LaNiO_3$, $SrRuO_3$, $NdNiO_3$, $PrNiO_3$, $SnO_2$:Sb, or a combination thereof. The lower electrode layer 501 may have a thickness that is sufficiently thick to allow the TDMIT material to exhibit conductivity.

The TDMIT material may be redeposited on sidewall of the variable resistance element 520 during forming the lower electrode layer 511 to for the sidewall protection layer 511. The sidewall protection layer 511 may have a thickness that is sufficiently thin to allow the TDMIT material to exhibit an insulating property. The thickness of the sidewall protection layer 511 may be determined depending on the TDMIT material included in the sidewall protection layer 511. Since the material layer redeposited by the IBE process has a thin thickness, the sidewall protection layer 511 may have a thickness that is sufficiently thin to allow the TDMIT material to exhibit an insulating property.

The buffer layer 502 may be disposed below the under layer 503 to facilitate crystal growth of the under layer 503, thus improving perpendicular magnetic crystalline anisotropy of the free layer 504. The buffer layer 502 may have a single-layer or multilayer structure including a metal, a metal alloy, a metal nitride, or a metal oxide, or a combination thereof. In some implementations, the buffer layer 502 may be formed of or include a material having a good compatibility with a bottom electrode (not shown) in order to resolve the lattice constant mismatch between the bottom electrode and the under layer 503. For example, the buffer layer may include tantalum (Ta).

The under layer 503 may be disposed under the free layer 504 and serve to improve perpendicular magnetic crystalline anisotropy of the free layer 504. The under layer 503 may have a single-layer or multilayer structure including a metal, a metal alloy, a metal nitride, or a metal oxide, or a combination thereof. In some implementations, the under layer 503 may have a single-layer or multilayer structure including a metal nitride. For example, the under layer 503 may include at least one of TaN, AlN, SiN, TiN, VN, CrN, GaN, GeN, ZrN, NbN, MoN or HfN.

The spacer layer 507 may be interposed between the magnetic correction layer 508 and the pinned layer 506 and function as a buffer between the magnetic correction layer 508 and the pinned layer 506. The spacer layer 507 may be used to improve characteristics of the magnetic correction layer 508. The spacer layer 507 may include a noble metal such as ruthenium (Ru).

The magnetic correction layer 508 may be used to offset the effect of the stray magnetic field produced by the pinned layer 506. In this case, the effect of the stray magnetic field of the pinned layer 506 can decrease, and thus a biased magnetic field in the free layer can decrease. The magnetic correction layer 508 may have a magnetization direction anti-parallel to the magnetization direction of the pinned layer 506. In the implementation, when the pinned layer 506 has a downward magnetization direction, the magnetic correction layer may have an upward magnetization direction. Conversely, when the pinned layer 506 has an upward magnetization direction, the magnetic correction layer 508 may have a downward magnetization direction. The magnetic correction layer 508 may be exchange coupled with the pinned layer 506 via the spacer layer 507 to form a synthetic anti-ferromagnet (SAF) structure. The magnetic correction layer 508 may have a single-layer or multilayer structure including a ferromagnetic material.

In this implementation, the magnetic correction layer 508 is located above the pinned layer 506, but the magnetic correction layer 508 may disposed at a different location. For example, the magnetic correction layer 508 may be located above, below, or next to the MTJ structure while the magnetic correction layer 508 is patterned separately from the MTJ structure.

The capping layer 509 may be used to protect the variable resistance element 520 and/or function as a hard mask for patterning the variable resistance element 520. In some implementations, the capping layer 509 may include various conductive materials such as a metal. In some implementations, the capping layer 509 may include a metallic material having almost none or a small number of pin holes and high resistance to wet and/or dry etching. In some implementations, the capping layer 509 may include a metal, a nitride, or an oxide, or a combination thereof. For example, the capping layer 509 may include a noble metal such as ruthenium (Ru).

The capping layer 509 may have a single-layer or multilayer structure. In some implementations, the capping layer 509 may have a multilayer structure including an oxide, or a metal, or a combination thereof. For example, the capping layer 509 may have a multilayer structure of an oxide layer, a first metal layer and a second metal layer.

A material layer (not shown) for resolving the lattice structure differences and the lattice constant mismatch between the pinned layer 506 and the magnetic correction layer 508 may be interposed between the pinned layer 506 and the magnetic correction layer 508. For example, this material layer may be amorphous and may include a metal a metal nitride, or metal oxide.

Next, a method for fabricating the semiconductor device of FIG. 5D will be described.

Referring to FIG. 5A, the first conductive line 510 may be formed over the substrate in which a predetermined structure is formed.

Then, a material layer 501A for forming the lower electrode layer may be formed over the first conductive line 510.

The material layer 501A may include a TDMIT material. In some implementations, the material layer 501A may include $V_2O_3$, $LaNiO_3$, $SrRuO_3$, $NdNiO_3$, $PrNiO_3$, $SnO_2$:Sb, or a combination thereof.

The material layer 501A may have a thickness that is sufficiently thick to allow the TDMIT material to exhibit conductivity. The thickness of the material layer 501A may be determined depending on the TDMIT material included in the material layer 501A.

Referring to FIG. 5B, a material layer 502A for forming the buffer layer, a material layer 503A for forming the under layer, a material layer 504A for forming the free layer, a material layer 505A for forming the tunnel barrier layer, a material layer 506A for forming the pinned layer, a material layer 507A for forming the spacer layer, a material layer 508A for forming the magnetic correction layer and a material layer 509A for forming the capping layer may be sequentially formed over the material layer 501A.

Referring to FIG. 5C, the lower electrode layer 501, the buffer layer 502, the under layer 503, the free layer 504, the tunnel barrier layer 505, the pinned layer 506, the spacer layer 507, the magnetic correction layer 508, the capping layer 509 and the sidewall protection layer may be formed by sequentially etching the material layer 509A, the material layer 508A, the material layer 507A, the material layer 506A, the material layer 505A, the material layer 504A, the material layer 503A, the material layer 502A and the material layer 501A through a patterning process using a mask pattern (not shown).

Here, the patterning process may be performed, for example, by an IBE process.

During the patterning process, the TDMIT material may be redeposited on sidewalls of the variable resistance element 520 by etching the material layer 501A to form the sidewall protection layer 511.

The sidewall protection layer 511 may have a thickness that is sufficiently thin to allow the TDMIT material to exhibit an insulating property. The thickness of the sidewall protection layer 511 may be determined depending on the TDMIT material included in the sidewall protection layer 511. Since the material layer redeposited by the IBE process has a thin thickness, the sidewall protection layer 511 may have a thickness that is sufficiently thin to allow the TDMIT material to exhibit an insulating property.

The sidewall protection layer 511 can allow for significantly reducing a shunt fail rate (SFR) of the variable resistance element 520 and a turnaround time (TAT) of the process. Further, it is possible to omit a separate process for removing the redeposited material.

Referring to FIG. 5D, the second conductive line 530 may be formed over the capping layer 509.

The semiconductor device formed by the method described in FIGS. 5A to 5D may include the substrate 500, the first conductive line 510, the variable resistance element 520 and the second conductive line 530. The variable resistance element 520 may include the lower electrode layer 501, the buffer layer 502, the under layer 503, the free layer 504, the tunnel barrier layer 505, the pinned layer 506, the spacer layer 507, the magnetic correction layer 508, the capping layer 509 and the sidewall protection layer 511. The lower electrode layer 501 may include the TDMIT material. The lower electrode layer 501 may have a thickness that is sufficiently thick to allow the TDMIT material to be conductive. The sidewall protection layer may include the redeposited TDMIT material derived from the lower electrode layer 501. The sidewall protection layer 511 may have a thickness that is sufficiently thin to allow the TDMIT material to exhibit an insulating property.

In the implementation, the semiconductor device includes the buffer layer 502, the under layer 503, the spacer layer 507, the magnetic correction layer 508 and the capping layer 509. In another implementation, at least one of the buffer layer 502, the under layer 503, the spacer layer 507, the magnetic correction layer 508 and the capping layer 509 may be omitted.

In the implementation, the upper electrode layer is omitted and the second conductive line 530 may perform the function of the upper electrode layer.

Figure 6A:
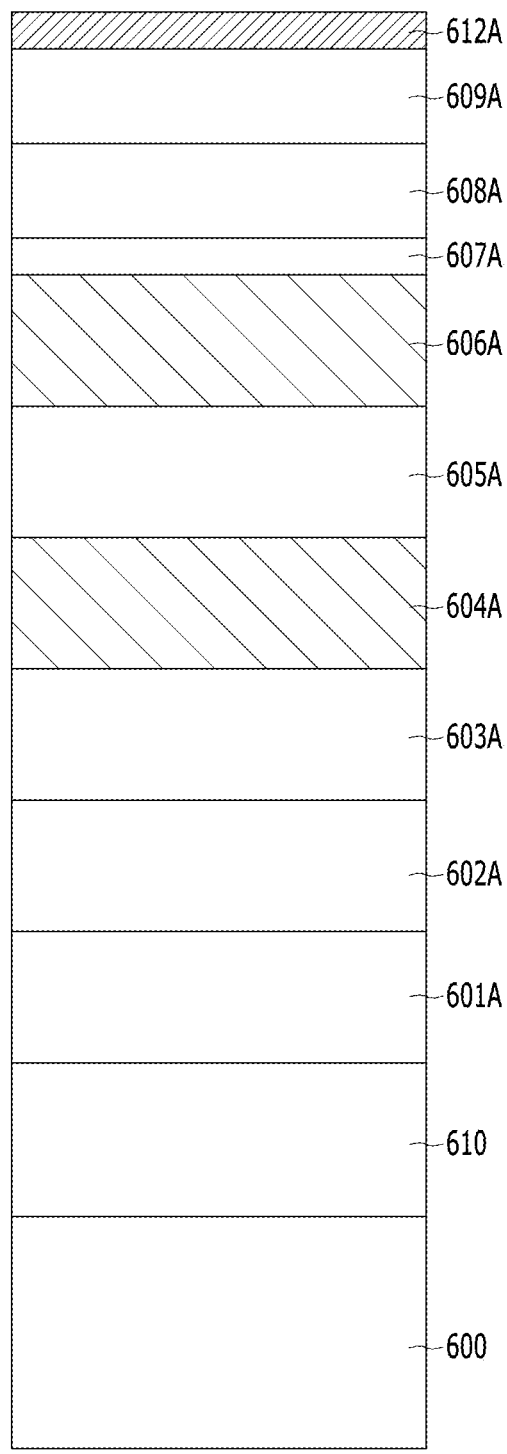
FIGS. 6A to 6C are cross-sectional views illustrating another example method for fabricating a semiconductor device based on some implementations of the disclosed technology.
Figure 6B:
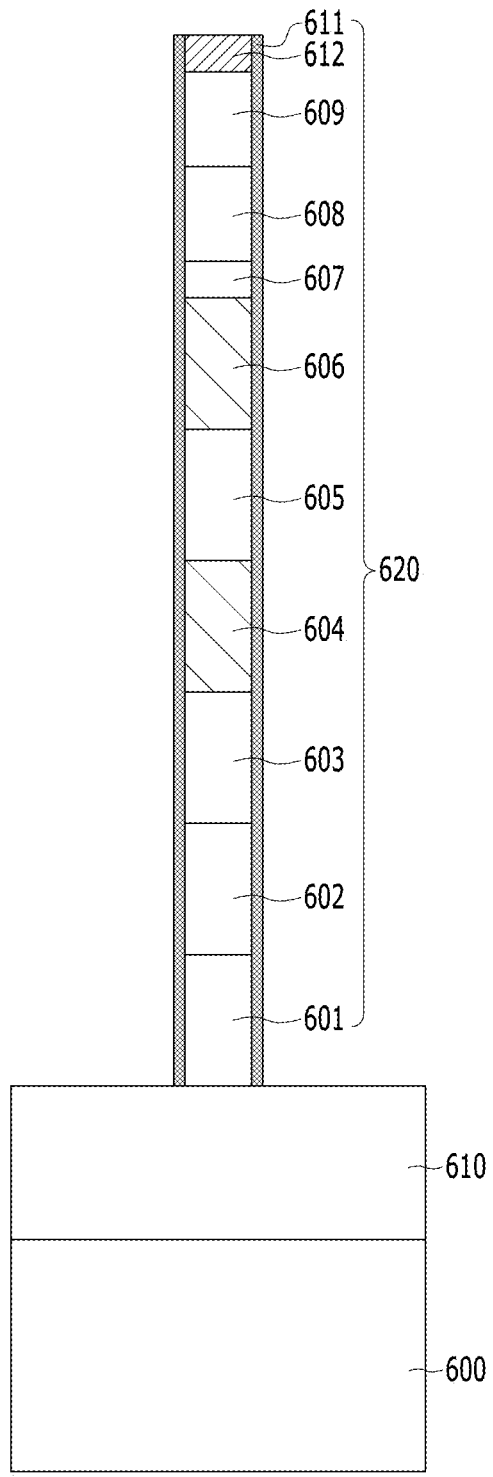
Figure 6C:
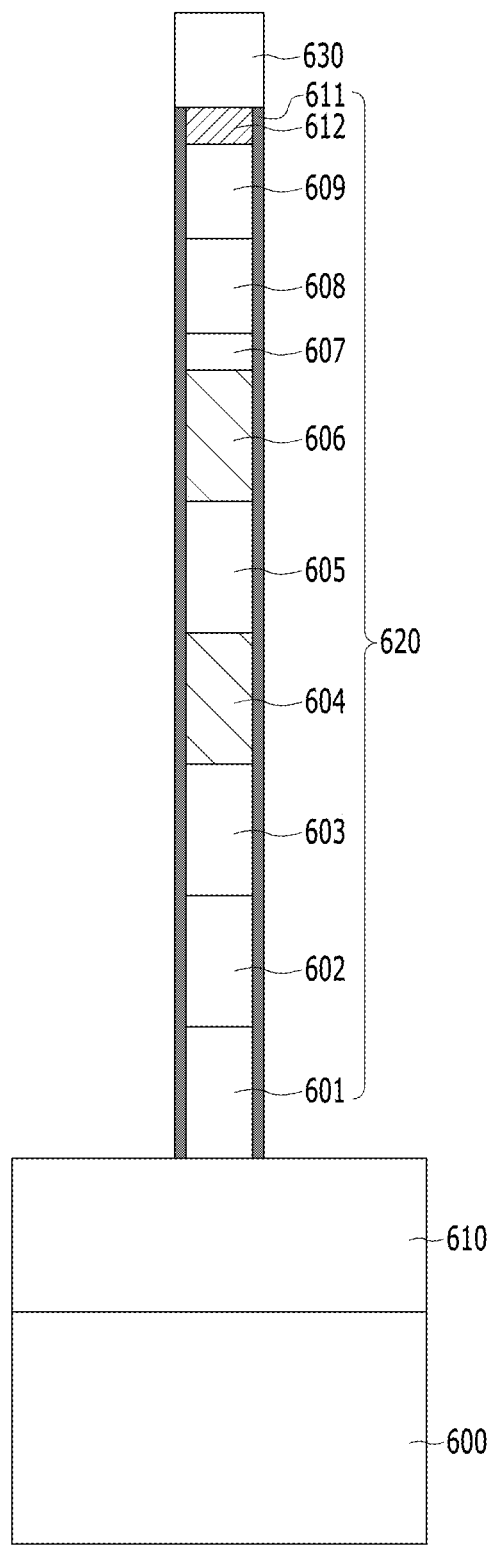

FIGS. 6A to 6C are cross-sectional views illustrating another example method for fabricating a semiconductor device based on some implementations of the disclosed technology. The detailed descriptions similar to those described in the implementation of FIGS. 5A to 5D will be omitted.

Referring to FIG. 6A, the first conductive line 610 may be formed over the 600 in which a predetermined structure is formed.

Then, a material layer 601A for forming a lower electrode layer, a material layer 602A for forming a buffer layer, a material layer 603A for forming an under layer, a material layer 604A for forming a free layer, a material layer 605A for forming a tunnel barrier layer, a material layer 606A for forming a pinned layer, a material layer 607A for forming a spacer layer, a material layer 608A for forming a magnetic correction layer, a material layer 609A for forming a capping layer and a material layer 612A for forming an upper electrode layer may be sequentially formed over the first conductive line 610.

The material layer 601A may have a single-layer or multilayer structure including various conductive materials such as a metal, a metal nitride, a conductive carbon material, or a combination thereof.

The material layer 612A may include a TDMIT material. In some implementations, the material layer 612A may include $V_2O_3$, $LaNiO_3$, $SrRuO_3$, $NdNiO_3$, $PrNiO_3$, $SnO_2$:Sb, or a combination thereof.

The material layer 612A may have a thickness that is sufficiently thick to allow the TDMIT material can exhibit conductivity. The thickness of the material layer 612A may be determined depending on the TDMIT material included in the material layer 501A.

Referring to FIG. 6B, a lower electrode layer 601, a buffer layer 602, an under layer 603, a free layer 604, a tunnel barrier layer 605, a pinned layer 606, a spacer layer 607, a magnetic correction layer 608, a capping layer 609, an upper electrode layer 612 and a sidewall protection layer 611 may be formed by sequentially etching the material layer 612A, the material layer 609A, the material layer 608A, the material layer 607A, the material layer 606A, the material layer 605A, the material layer 604A, the material layer 603A, the material layer 602A and the material layer 601 through a patterning process using a mask pattern (not shown). The lower electrode layer 601, the buffer layer 602, the under layer 603, the free layer 604, the tunnel barrier layer 605, the pinned layer 606, the spacer layer 607, the magnetic correction layer 608, the capping layer 609, the upper electrode layer 612 and the sidewall protection layer may form a variable resistance element 620.

Here, the patterning process may be performed, for example, by an IBE process.

During the patterning process, the TDMIT material may be redeposited on sidewalls of the variable resistance element 620 by etching the material layer 612A to form the sidewall protection layer 611.

The sidewall protection layer 611 may have a thickness that is sufficiently thin to allow the TDMIT material to exhibit an insulating property. The thickness of the sidewall protection layer 611 may be determined depending on the TDMIT material included in the sidewall protection layer 611. Since the material layer redeposited by the IBE process has a thin thickness, the sidewall protection layer 611 may have a thickness that is sufficiently thin to allow the TDMIT material to exhibit an insulating property.

The sidewall protection layer 611 can allow for significantly reducing a shunt fail rate (SFR) of the variable resistance element 620 and a turnaround time (TAT) of the process. Further, it is possible to omit a separate process for removing the redeposited material.

Referring to FIG. 6C, a second conductive line 630 may be formed over the upper electrode layer 612.

The semiconductor device formed by the method described in FIGS. 6A to 6C may include the substrate 600, the first conductive line 610, the variable resistance element 620 and the second conductive line 630. The variable resistance element 620 may include the lower electrode layer 601, the buffer layer 602, the under layer 603, the free layer 604, the tunnel barrier layer 605, the pinned layer 606, the spacer layer 607, the magnetic correction layer 608, the capping layer 609, the upper electrode layer 612 and the sidewall protection layer 611. The upper electrode layer 612 may include the TDMIT material. The upper electrode layer 612 may have a thickness that is sufficiently thick to allow the TDMIT material to be conductive. The sidewall protection layer 611 may include the redeposited TDMIT material derived from the upper electrode layer 612. The sidewall protection layer 611 may have a thickness that is sufficiently thin to allow the TDMIT material to exhibit an insulating property.

In the implementation, the upper electrode layer 612 is formed of or includes the TDMIT material. In another implementation, the lower electrode layer 601 may be formed of or include the TDMIT material. In another implementation, both the lower electrode layer 601 and the upper electrode layer 612 may be formed of or include the TDMIT material.

Moreover, in the implementation, the semiconductor device includes the lower electrode layer 601 and the upper electrode layer 612. In another implementation, the lower electrode layer 601 may be omitted. In case that the lower electrode layer 601 is omitted, the first conductive line 610 may perform a function of the lower electrode layer 601.

In the implementation, the semiconductor device includes the buffer layer 602, the under layer 603, the spacer layer 607, the magnetic correction layer 608 and the capping layer 609. In another implementation, at least one of the buffer layer 602, the under layer 603, the spacer layer 607, the magnetic correction layer 608 and the capping layer 609 may be omitted.

Only a few embodiments and examples are described. Enhancements and variations of the disclosed embodiments and other embodiments can be made based on what is described and illustrated in this patent document.

What is claimed is:

1. A method for fabricating a semiconductor device comprising:
    forming a thickness dependent metal-insulator transition (TDMIT) material layer, the TDMIT material layer having an electrical resistance depending on a thickness of the TDMIT material;
    forming a variable resistance layer under or above the TDMIT material layer; and
    performing a patterning process on the TDMIT material layer and the variable resistance layer to form an electrode layer and a variable resistance layer pattern.

2. The method according to claim 1, wherein the performing of the patterning process includes forming the electrode layer such that the TDMIT material of the electrode layer has a first thickness that allows the TDMIT material to exhibit conductivity.

3. The method according to claim 1, further including forming a sidewall protection layer including the TDMIT material on sidewalls of the variable resistance layer pattern.

4. The method according to claim 3, wherein the forming of the sidewall protection layer includes redepositing atoms in the TDMIT material on sidewalls of the variable resistance layer pattern.

5. The method according to claim 3, wherein the forming of the sidewall protection layer forms the sidewall protection layer such that the TDMIT material of the sidewall protection layer has a second thickness that allows the TDMIT material to exhibit an insulating property.

6. The method according to claim 1, wherein the TDMIT material layer includes at least one of $V_2O_3$, $LaNiO_3$, $SrRuO_3$, $NdNiO_3$, $PrNiO_3$, or $SnO_2$:Sb, or a combination thereof.

7. The method according to claim 3, wherein the electrode layer is formed to have a thickness greater than that of the sidewall protection layer.

8. The method according to claim 1, further comprising: forming a selector layer under or above the electrode layer.

9. The method according to claim 1, wherein the performing of the patterning process forms the electrode layer to be disposed under or above the variable resistance layer pattern.

10. The method according to claim 1, further comprising:
    forming an additional electrode layer including the TDMIT material such that the variable resistance layer is disposed between the electrode layer and the additional electrode layer.

* * * * *